(12) United States Patent
Saito

(10) Patent No.: US 8,686,816 B2
(45) Date of Patent: Apr. 1, 2014

(54) MEMS ELEMENT AND METHOD OF MANUFACTURING THE SAME

(75) Inventor: Tomohiro Saito, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 1007 days.

(21) Appl. No.: 12/704,836

(22) Filed: Feb. 12, 2010

(65) Prior Publication Data
US 2010/0213039 A1  Aug. 26, 2010

(30) Foreign Application Priority Data

Feb. 24, 2009  (JP) ................ 2009-041382

(51) Int. Cl.
*H01H 51/22* (2006.01)
(52) U.S. Cl.
USPC .......................................... 335/78; 200/181
(58) Field of Classification Search
USPC .......................................... 335/78; 200/181
See application file for complete search history.

(56) References Cited

U.S. PATENT DOCUMENTS

| 6,657,525 | B1* | 12/2003 | Dickens et al. | 335/78 |
| 2005/0041916 | A1* | 2/2005 | Miller et al. | 385/18 |
| 2009/0272635 | A1* | 11/2009 | Suzuki | 200/181 |
| 2011/0111545 | A1* | 5/2011 | El-Gamal | 438/50 |
| 2011/0274839 | A1* | 11/2011 | Fragala et al. | 427/265 |

FOREIGN PATENT DOCUMENTS

| CN | 1661769 A | 8/2005 |
| CN | 101353153 A | 1/2009 |
| JP | 6-86325 U | 12/1994 |
| JP | 2003-264123 A | 9/2003 |
| JP | 2004-74341 A | 3/2004 |
| JP | 2006-30585 A | 2/2006 |
| JP | 2006-175557 | 7/2006 |
| JP | 2006-263905 | 10/2006 |
| JP | 2007-24946 | 2/2007 |
| JP | 2007-30090 A | 2/2007 |

OTHER PUBLICATIONS

Machine Translation of Applican Cited Prior Art JP 2006-30585 A.*
Japanese Office Action issued Oct. 16, 2012 in Patent Application No. 2009-041382 (with English translation).
Office Action issued Nov. 2, 2011 in Chinese Application No. 201010121487.0 (With English Translation).
Office Action issued Jul. 24, 2012 in Japanese Patent Application No. 2009-041382 with English language translation.
U.S. Appl. No. 13/413,889, filed Mar. 7, 2012, Saito.

* cited by examiner

*Primary Examiner* — Bernard Rojas
(74) *Attorney, Agent, or Firm* — Oblon, Spivak, McClelland, Maier & Neustadt, L.L.P.

(57) ABSTRACT

A MEMS element of an aspect of the present invention including a first electrode provided on a substrate, a second electrode which is provided above the first electrode and which is driven toward the first electrode, an anchor provided on the substrate, a beam which supports the second electrode in midair, one end of the beam being connected to the anchor and the beam including a sidewall part provided at its end in the width direction, the sidewall part having a downward-facing protrusion.

19 Claims, 10 Drawing Sheets

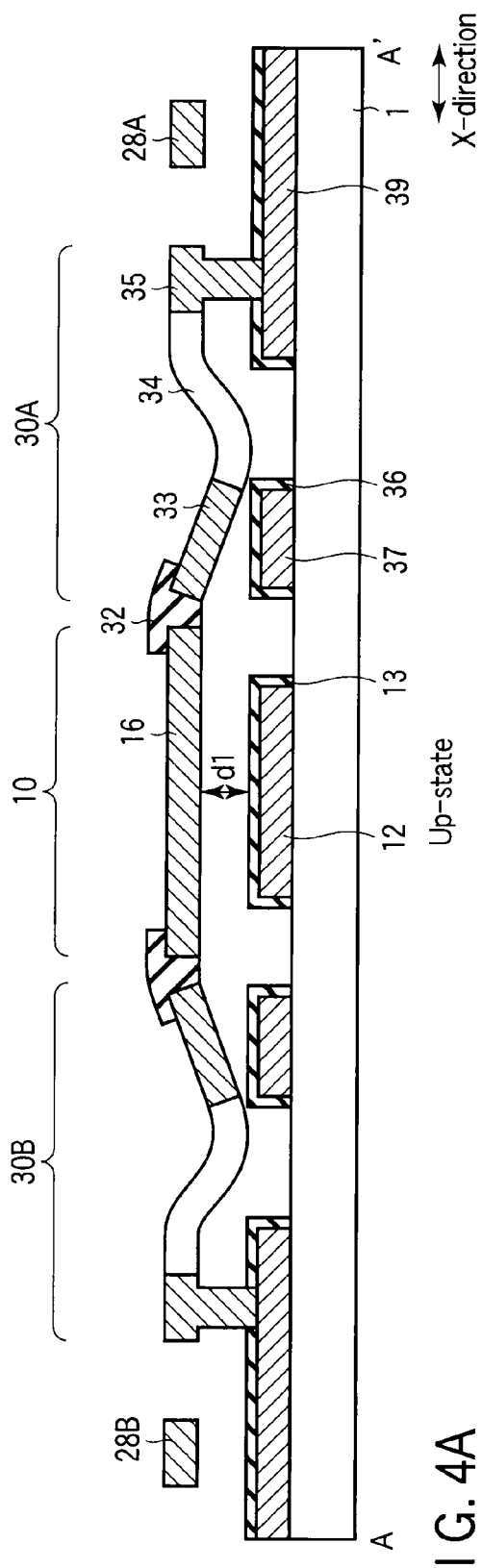
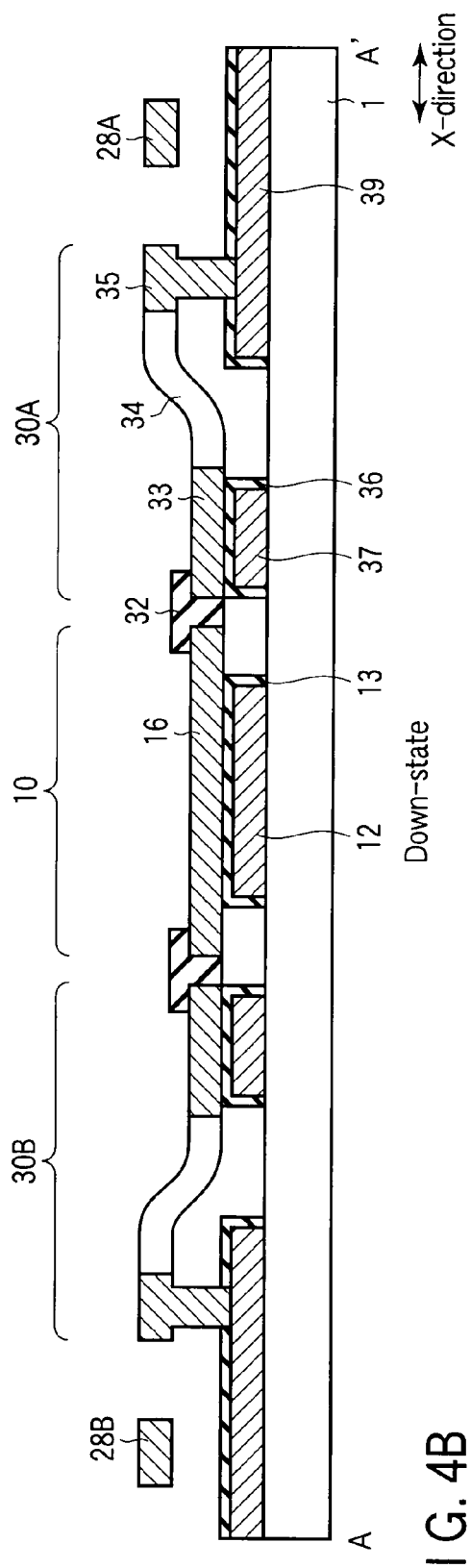

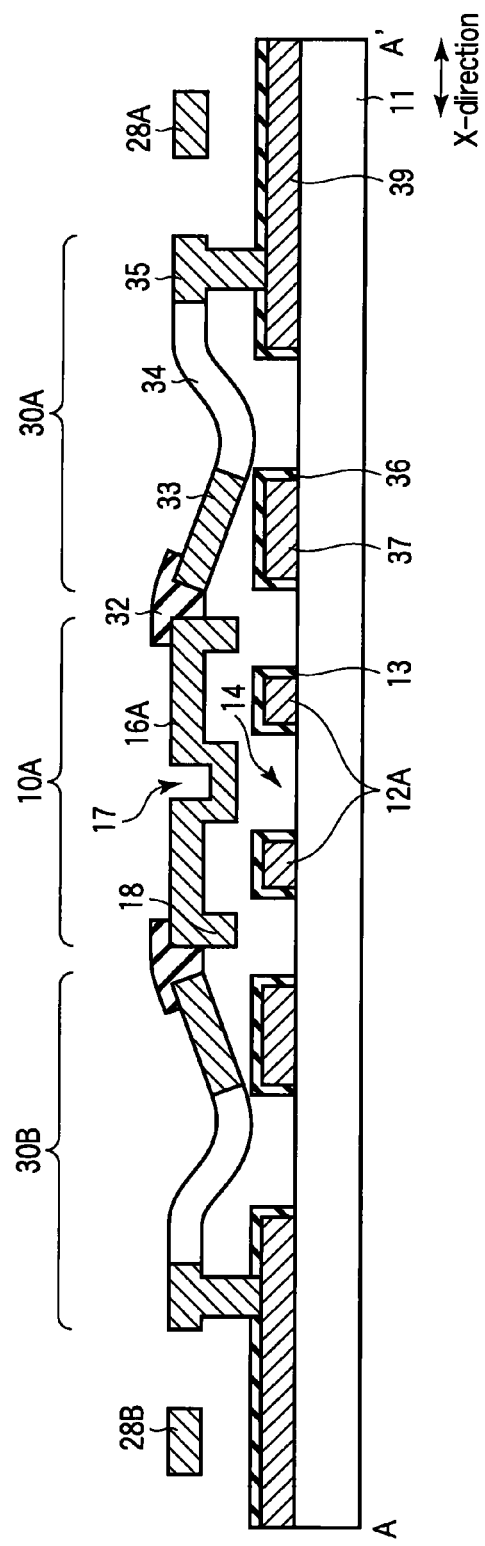
F I G. 6

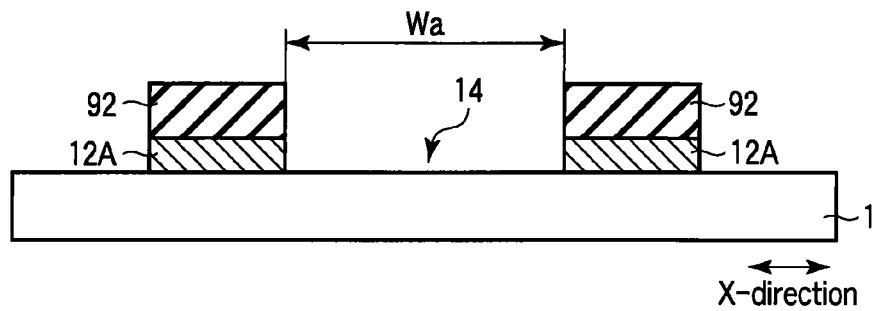
F I G. 7A
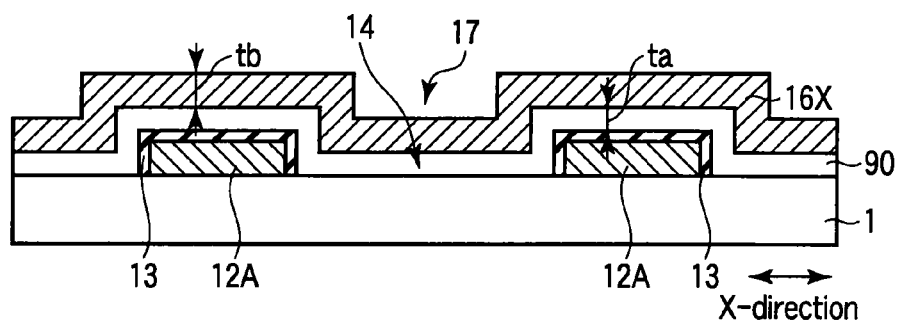
F I G. 7B
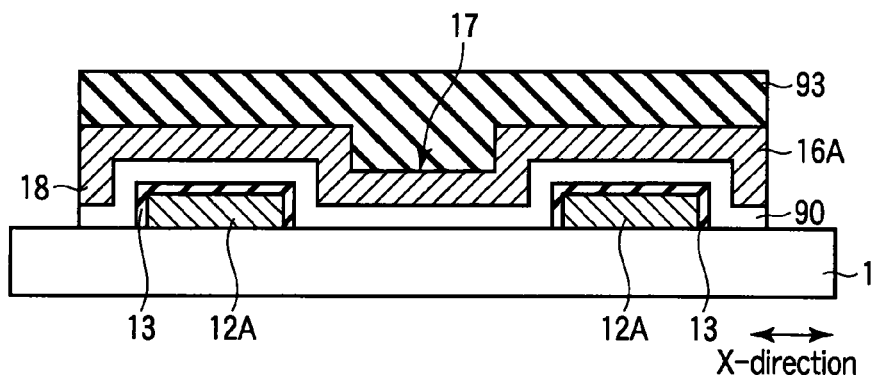
F I G. 7C

B-B' section

B-B' section

B-B' section

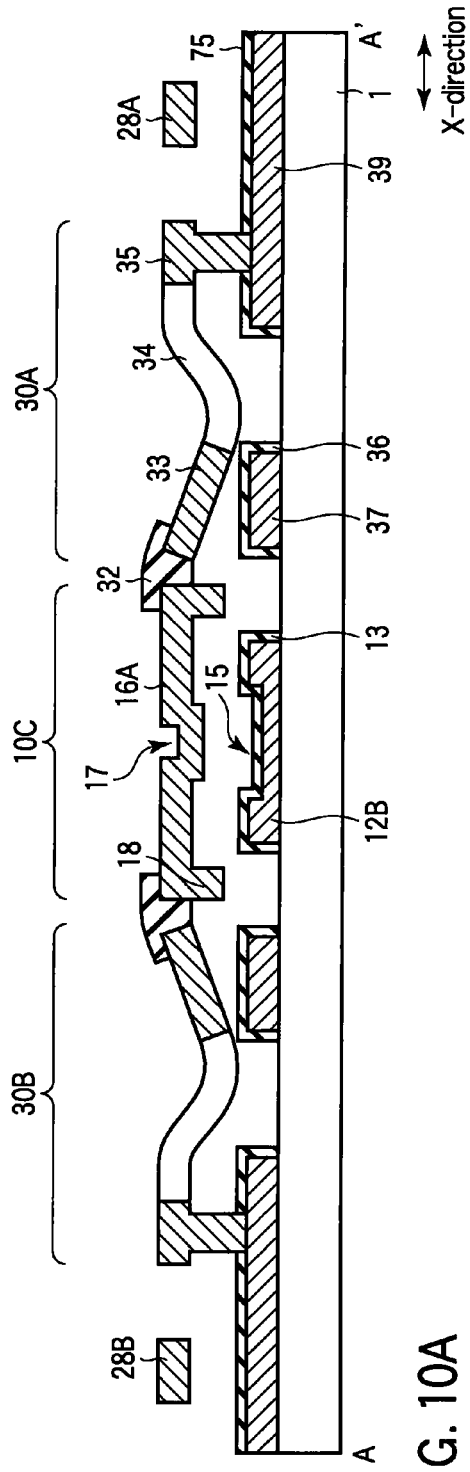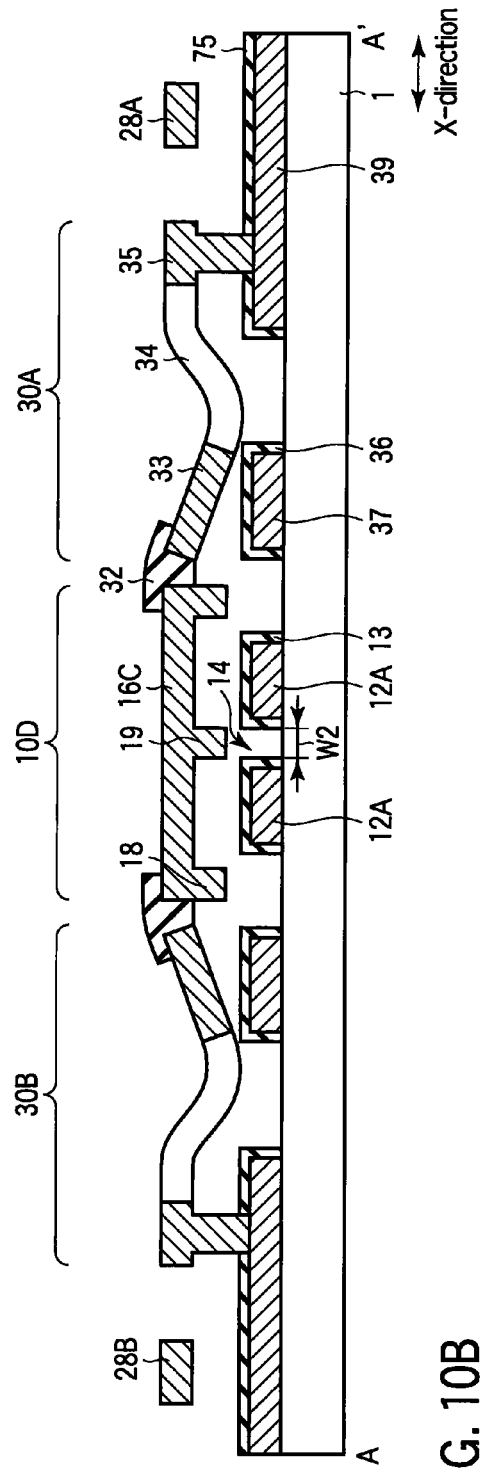
F I G. 10A
F I G. 10B

1

MEMS ELEMENT AND METHOD OF MANUFACTURING THE SAME

CROSS-REFERENCE TO RELATED APPLICATIONS

This application is based upon and claims the benefit of priority from prior Japanese Patent Application No. 2009-041382, filed Feb. 24, 2009, the entire contents of which are incorporated herein by reference.

BACKGROUND

In recent years, micro-electromechanical systems (MEMS) have attracted attention as one of the techniques for streamlining a complicated circuit system. MEMS is the technique for forming a movable three-dimensional structure minutely using, for example, semiconductor process technology (e.g., refer to JP 2006-263905).

SUMMARY

A MEMS element of an aspect of the present invention comprising: a first electrode provided on a substrate; a second electrode which is provided above the first electrode and which is driven toward the first electrode; an anchor provided on the substrate; a beam which supports the second electrode in midair, one end of the beam being connected to the anchor and the beam including a sidewall part provided at its end in the width direction, the sidewall part having a downward-facing protrusion.

A MEMS element manufacturing method of an aspect of the present invention comprising: forming a first electrode and a dummy layer on a substrate; forming a sacrificial layer with an upward-facing convex part on the first electrode and the dummy layer; forming a second electrode above the first electrode and forming a beam with a sidewall part based on the convex part of the sacrificial layer above the dummy layer; and removing the sacrificial layer and forming a cavity between the dummy layer and the beam, between the dummy layer and the sidewall part, and between the first electrode and the second electrode.

BRIEF DESCRIPTION OF THE DRAWING

FIGS. 4A and 4B are sectional views to explain the operation of the MEMS element according to the first embodiment;

FIG. 6 is a sectional view showing a structure of the MEMS element according to the second embodiment;

FIGS. 7A, 7B and 7C are sectional views to explain a method of manufacturing the MEMS element according to the second embodiment;

FIGS. 10A and 10B are sectional views showing structures of modifications of the MEMS element according to the embodiments.

DETAILED DESCRIPTION

MEMS elements are used as, for example, variable-capacitance elements or switches. A MEMS element used as a variable-capacitance element (hereinafter, referred to as a MEMS variable-capacitance element) includes a pair of signal electrodes as a movable structure. One electrode, which acts as a lower signal electrode, is fixed on, for example, a substrate. The other electrode, which acts as an upper signal electrode, is provided above the lower signal electrode in such a manner that it is supported in midair. A space (cavity) is secured between the two signal electrodes.

The upper signal electrode is driven upward and downward by, for example, an actuator connected to the upper signal electrode, thereby changing the distance between the upper signal electrode and the lower signal electrode, which changes the capacitance developed between the two electrodes.

The driving speed of the MEMS variable-capacitance element depends on the physical driving speed of the upper signal electrode. As shown by resonance frequency, the driving speed correlates with the upper signal electrode and the shape, thickness, and the like of a member supporting the upper signal electrode. Therefore, a sufficiently high driving speed cannot be obtained due to the limits of the structure of the MEMS element, which becomes a problem. Accordingly, the application range of MEMS elements is limited to the range of their operating characteristics.

Furthermore, because of intrinsic stress (film stress) in materials used for an electrode and the supporting member and joining member for the electrode, a deflection or a distortion is caused particularly in an electrode supported in midair to secure a movable range as in the upper signal electrode. The deformation of the electrodes results in the nonuniformity of the distance between the two electrodes or a decrease in the contact area of the two electrodes. In this case, the MEMS variable-capacitance element cannot have a specific capacitance. Moreover, in a MEMS element used as a switch (hereinafter, referred to as a MEMS switch), the contact area when the switch is on decreases.

Hereinafter, referring to the accompanying drawings, embodiments of invention will be explained in detail.

(1) First Embodiment

A first embodiment of the invention will be explained with reference to FIG. 1 to FIG. 4B.

(a) Structure

A MEMS element according to the first embodiment will be explained with reference to FIGS. 1 to 3C. In the first embodiment, a MEMS element used as a variable capacitance will be described. Hereinafter, a MEMS element according to the first embodiment is referred to as a MEMS variable-capacitance element.

Figure 1:
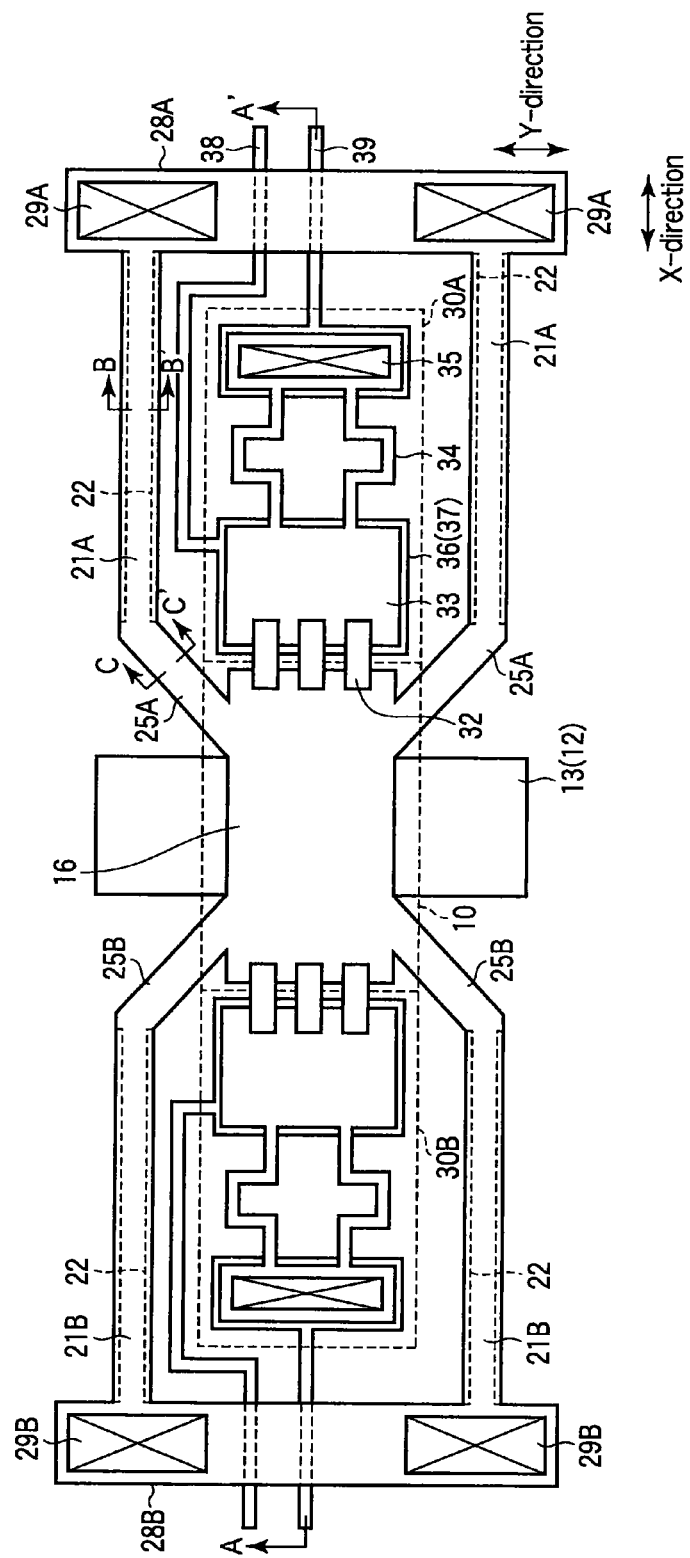
FIG. 1 is a plan view showing a structure of a MEMS element according to a first embodiment of the invention.
Figure 2A:
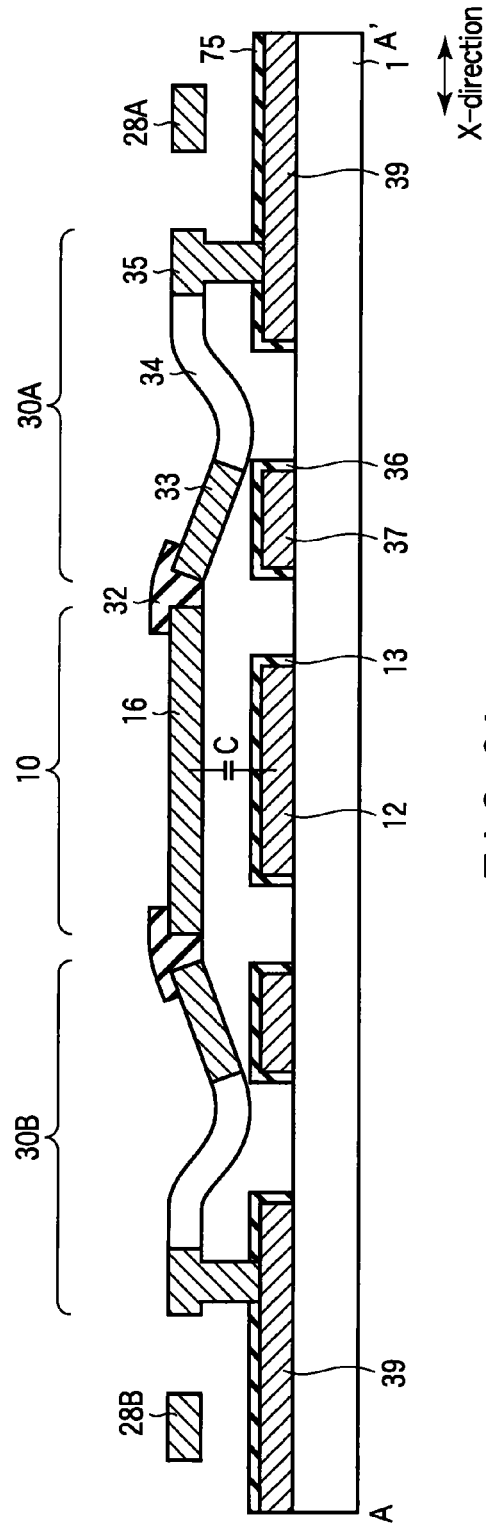
FIGS. 2A, 2B and 2C are sectional views showing the structure of the MEMS element according to the first embodiment.
Figure 2C:
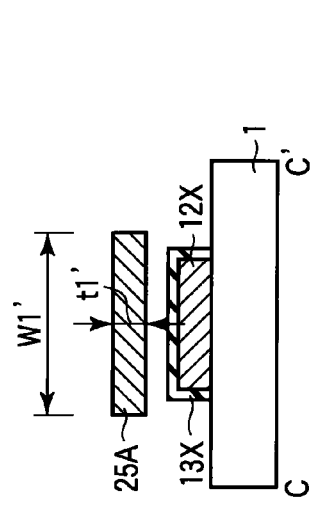
Figure 2B:
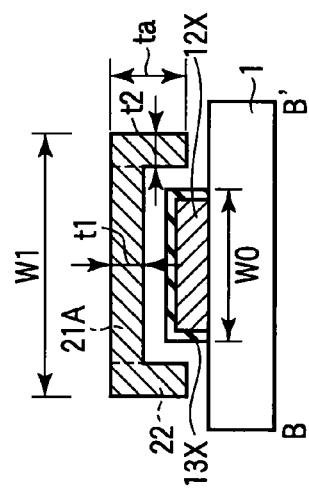

FIG. 1 is a plan view of a MEMS variable-capacitance element according to the first embodiment. FIGS. 2A to 2C is a sectional view of the MEMS variable-capacitance element according to the first embodiment. FIG. 2A shows a cross-section structure taken along line A-A' of FIG. 1. FIG. 2B shows a cross-section structure taken along line B-B' of FIG. 1. FIG. 2C shows a cross-section structure taken along line C-C' of FIG. 1. In FIG. 2A, members provided in front of and behind the cross section along line A-A' are also shown as needed.

As shown in FIGS. 1 and 2A, a MEMS variable-capacitance element of the first embodiment is provided on a substrate 1. The substrate 1 is, for example, an insulating substrate, such as glass, or an insulating layer or the like formed on a silicon substrate.

A movable structure 10 constituting the MEMS variable-capacitance element includes a lower signal electrode (or a first electrode) 12 and an upper signal electrode (or a second electrode) 16. Lower signal electrode 12 and upper signal electrode 16 are made of metal, such as aluminum (Al), gold (Au) or platinum (Pt).

A space (cavity) is provided between lower signal electrode 12 and upper signal electrode 16. Lower signal electrode 12 is provided on the substrate 1 so as to extend in the Y-direction. Lower signal electrode 12 is secured to the substrate 1. The surface of lower signal electrode 12 is covered with, for example, an insulating film 13. Lower signal electrode 12 is used as, for example, a signal line. The substrate 1 below lower signal electrode 12 or a part of the insulating film on the substrate 1 may be removed by techniques using a sacrificial layer or the like, thereby leaving a space below lower signal electrode 12.

Upper signal electrode 16 is provided above lower signal electrode 12. Upper signal electrode 16 is supported in midair by beams 21A and 21B and anchors 29A and 29B so as to leave a space between lower signal electrode 12 and upper signal electrode 16. Upper signal electrode 16, which has a rectangular planar shape, extends in the X-direction. Signal electrodes 12 and 16 are not limited to a rectangular planar shape and may assume a shape including a curve, such as an elliptical planar shape. Moreover, signal electrodes 12 and 16 may have holes passing through from their top to bottom surfaces.

Anchors 29A and 29B are provided on, for example, an interconnect layer (or conducting layer) on the substrate 1 or a substrate 1.

Beams 21A, 21B, 25A and 25B, which extend in the X-direction, are connected to both ends of upper signal electrode 16 in the X-direction. For example, beams 21A and 25A on the right side in FIG. 1 are drawn from the other end of upper signal electrode 16 in two routes and connected to anchor 29A via a conducting layer 28A. Beams 21B and 25B on the left side in FIG. 1 are drawn from one end of upper signal electrode 16 in two routes and connected to anchor 29B via a conducting layer 28B.

Beams 21A, 21B, 25A and 25B are supported in midair by anchors 29A and 29B with a space (cavity) between beams 21A, 21B, 25A and 25B and the substrate 1. Beams 25A and 25B are joined directly to upper signal electrode 16 and drawn obliquely from the end of upper signal electrode 16 in the X-Y plane. Hereinafter, to clarify the explanation, beams 25A and 25B drawn obliquely are referred to as joining parts 25A and 25B. Beams 21A and 21B and joining parts 25A and 25B may be made of the same material as that of upper signal electrode 16 or a different material, such as an insulating material. When an insulating material is used for beams 21A and 21B and joining parts 25A and 25B, interconnect lines may be provided on the top surface of or the underside of the insulating material constituting beams 21A and 21B as needed.

While in the first embodiment, beams 21A and 21B each have a planar shape extending in the X-direction and joining parts 25A and 25B each have a planer shape drawn obliquely, the planar shape of each of beams 21A and 21B and joining parts 25A and 25B is not limited to the planar shapes, provided that they can support upper signal electrode 16 in midair. In addition, the number of beams 21A and 21B and that of joining parts 25A and 25B are not limited to the above examples.

FIGS. 2B and 2C show cross-section structures of beams 21A, 21B, 25A and 25B.

As shown in FIG. 2B, each of beams 21A and 21B has a sidewall part 22. The sidewall part 22 is provided at one and the other ends of an extension portion of each of beams 21A and 21B in a direction (width direction) crossing the direction (longitudinal direction) in which the beam extends. For example, the sidewall part 22 projects from the underside of each of beams 21A and 21B toward the substrate 1, forming a downward-facing projection. The sidewall part 22 extends in the direction in which each of beams 21A and 21B extend. The sidewall part 22 is provided at both ends of each of beams 21A and 21B, with the result that each of beams 21A and 21B has, for example, a downward-facing concave structure as shown in FIG. 2B. One sidewall part 22 may be provided at only one end of beam 21A in a width direction FIG. 2C shows a cross-section structure of each of joining parts 25A and 25B. As shown in FIG. 2C, a sidewall part is not provided at the ends of each of joining parts 25A and 25B, forming a flat-plate structure. Unlike each of joining parts 25A and 25B shown in FIG. 2C, a dummy layer 12X may not be provided below the beam with no sidewall. In this case, to increase the stability and reliability of the operation of the MEMS element, it is desirable to design the length and width of each of joining parts 25A and 25B so that the distance between the top surface of the substrate 1 and the underside of each of joining parts 25A and 25B may be almost equal to the distance between the top surface of the substrate 1 and the underside of each of beams 21A and 21B.

As shown in FIGS. 2B and 2C, the part of each of beams 21A and 21B at which the sidewall 22 is provided has a width W1 and the part of each of joining parts 25A and 25B has a width W1'. Beams 21A and 21B each have a film thickness t1 and joining parts 21A and 21B each have a film thickness t1'. The film thickness of the sidewall part 22 is a dimension in a direction parallel to the surface of the substrate 1. The sidewall part 22 has a film thickness t2.

Width W1 of beams 21A and 21B is, for example, not less than width W1' of joining parts 25A and 25B. For example, width W1 is greater than width W1' by twice film thickness t2 of the sidewall part 22. For example, film thickness t1 is almost the same as film thickness t1'. Moreover, film thickness t2 of the sidewall part 22 may be equal to or differ from each of the film thicknesses t1 and t1'. In the first embodiment, width W1 of the beam is the dimension between the ends of the two sidewall parts in a direction parallel to the substrate surface.

In FIGS. 2B and 2C, a dummy layer 12X is provided on the substrate 1 below beams 21A and 21B and joining parts 25A and 25B. A space is left between each of beams 21A and 21B and dummy layer 12X and between joining parts 25A and 25B and dummy layer 12X. On the surface of dummy layer 12X, for example, an insulating film 13X is provided. Dummy layer 12X is made of the same material as that of lower signal electrode 12 simultaneously. Dummy layer 12X may be used as a part of a leading line or may not function as an interconnect line.

For example, width W1 of beams 21A and 21B is greater than width W0 of dummy layer 12X by not less than twice film thickness t2 of the sidewall part 22. Dummy layer 12X, of course, need not be formed simultaneously with lower signal electrode 12. In addition, dummy layer 12X need not be made of the same material as that of lower signal electrode 12.

While in the first embodiment, a sidewall part is not provided on each of joining parts 25A and 25B, it may, of course, be provided at the ends of each of joining parts 25A and 25B as beams 21A and 21B. Although in FIG. 1, the sidewall 22 is continuous in the direction in which each of beams 21A and 21B extend, it may be segmented at specified positions suitably.

On both sides of upper signal electrode 16 in the X-direction, double-support (or bridge-structure) actuators 30A and 30B are provided. In FIG. 1, actuator 30A on the right side of FIG. 1 is located between the two branches of beam 21A and actuator 30B on the left side of FIG. 1 is located between the two branches of beam 21B.

In FIGS. 1 to 2C, actuator 30A on the right side includes an upper driving electrode 33 and a lower driving electrode 37. Like the actuator on the right side, actuator 30B on the left side includes an upper driving electrode and a lower driving electrode as. The two actuators 30A and 30B have almost the same structure and therefore an explanation will be given, centering on the structure of actuator 30A.

Lower driving electrode 37 is secured to the substrate 1. The surface of lower driving electrode 37 is covered with, for example, an insulating film 36. Lower driving electrode 37 is connected to, for example, an interconnect line 38. Lower driving electrode 37 has, for example, a rectangular planar shape.

Upper driving electrode 33 is provided above lower driving electrode 37. Upper driving electrode 37 has a rectangular planar shape. In the two actuators 30A and 30B, each of upper driving electrodes 33 passes through an insulating layer 32 and is connected to one and the other ends of upper signal electrode 16 of the movable structure 10. The insulating layer 32 is made of an insulating material, such as silicon nitride. Upper signal electrode 16 and upper driving electrode 33 are electrically insulating from each other. If signal electrode 16 is allowed to be electrically connected to driving electrode 33, a conductive material may be used in place of the insulating layer. Alternatively, upper signal electrode 16 and upper driving electrode 33 may be configured to be a single continuous layer without using an insulating layer.

To the ends of upper driving electrode 33 facing the upper signal electrode, spring structures 34 are connected. The planar shape of the spring structure 34 is, for example, a meandering shape. The line width of an interconnect line constituting the spring structure 34 is made less than the line width of an interconnect line constituting, for example, beams 21A and 21B and joining parts 25A and 25B. The spring structure 34 is connected to, for example, an anchor 35. Anchor 35 is provided on, for example, an interconnect line (conducting layer) 39 on the substrate 1. The spring structure 34 and anchor 35 are made of, for example, a conductive material.

A potential is applied to upper driving electrode 33 by way of anchor 35 provided on the interconnect line 38 and the spring structure 34. To lower driving electrode 37, a potential is applied via the interconnect line 39. This causes a potential difference between upper driving electrode 33 and lower driving electrode 38. On the interconnect line 39, for example, an insulating film 75 is provided.

Actuators 30A and 30B of the first embodiment are, for example, electrostatically-driven actuators. That is, in actuators 30A and 30B, when a potential difference is applied between upper driving electrode 33 and lower driving electrode 37, electrostatic attractive force generated between driving electrodes 33 and 37 causes upper driving electrode 33 to move in a direction perpendicular to the surface of the substrate 1. As a result of the operation of upper driving electrode 33, upper signal electrode 12 constituting the movable structure (variable capacitance) 10 is driven.

The capacitance C of the MEMS variable-capacitance element is produced between lower signal electrode 12 and upper signal electrode 16 constituting the movable structure 10. Actuators 30A and 30B drive upper signal electrode 16 in a direction perpendicular to the surface of the substrate 1, causing the distance between upper signal electrode 16 and lower signal electrode 12 to vary, which causes the value of the capacitance of the variable-capacitance element to vary.

While in the first embodiment, an electrostatically-driven actuator has been used as the actuator which drives the upper signal electrode, the invention is not limited to this. For instance, a thermally-driven, a piezoelectrically-driven, or a magnetically-driven actuator may, of course, be used. In the MEMS element of the first embodiment, two actuators have been provided on one movable structure (variable capacitance). The invention is not limited to this. For instance, one movable structure may be driven by a single actuator or by three or more actuators. While in FIG. 2A, upper driving electrode 33 has an inclined structure with respect to the surface of the substrate, the invention is not limited to this. For instance, upper driving electrode 33 may have a parallel structure with respect to the surface of the substrate.

In the movable structure 10 and electrostatic actuators 30A and 30B of the first embodiment, insulating films 13 and 36 have been formed on the top surface of the electrodes 12 and 37 in the lower layer, respectively. The invention is not limited to this. For instance, instead of forming an insulating film on the top surface of each of signal electrode 12 and driving electrode 37 in the lower layer, an insulating film may be formed on the underside of each of signal electrode 16 and driving electrode 33 in the upper layer. A member constituting the MEMS variable-capacitance element is not necessarily a single-layer film. For example, signal electrodes 12 and 16 of the movable structure 10 and driving electrodes 33 and 37 of actuators 30A and 30B may be composed of a stacked film of metal and an insulating material or of metal and semiconductor.

The MEMS element of the first embodiment is characterized in that beams 21A and 21B supporting the movable structure 10 have the sidewall parts 22 at their ends as shown in FIG. 2B.

As in the MEMS variable-capacitance element of the first embodiment, when the sidewall parts 22 are provided at the ends of beams 21A and 21B in the width direction, film thickness to at the ends of each of beams 21A and 21B in the vertical direction with respect to the substrate surface is greater than film thickness t1 between the ends of each of beams 21A and 21B. As a result, the rigidity of beams 21A and 21B in the vertical direction with respect to the surface of the substrate 1 increases. This improves the elastic coefficient (or spring constant) of beams 21A and 21B and therefore the resonance frequency of the MEMS variable-capacitance element increases. Therefore, the mechanical vibration of the MEMS element can be made faster.

In addition, the rigidity of the beams is increased by providing the sidewall parts 22 at the ends of beams 21A and 21B as in the first embodiment, which suppresses the distortion of beams 21A and 21B and the bend of upper electrode 16 supported in midair by beams 21A and 21B. Therefore, the element characteristics of the MEMS element can be improved.

Accordingly, with the first embodiment, the element characteristics of the MEMS can be improved.

(b) Manufacturing method

Figure 3A:
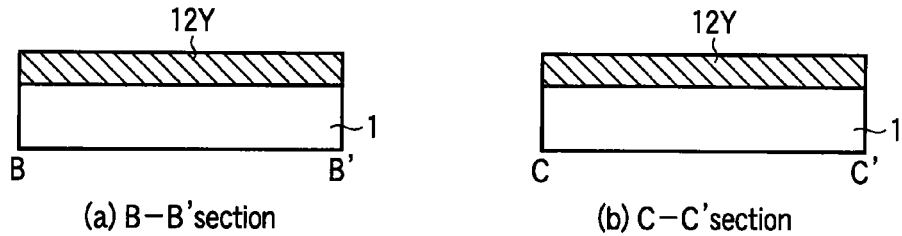
FIGS. 3A, 3B and 3C are sectional views to explain a method of manufacturing the MEMS element according to the first embodiment.
Figure 3B:
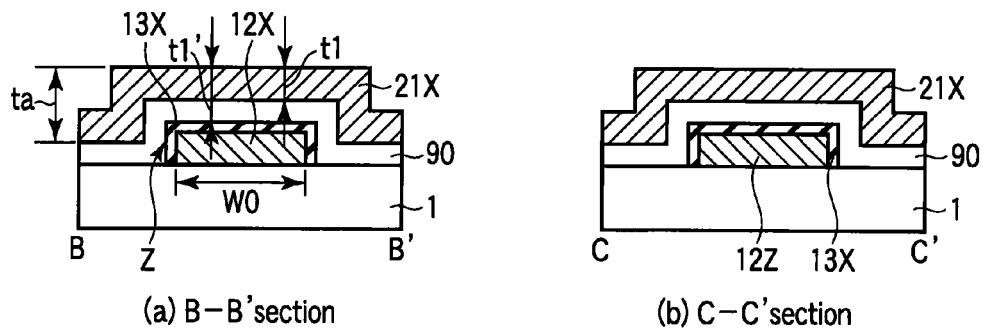
Figure 3C:
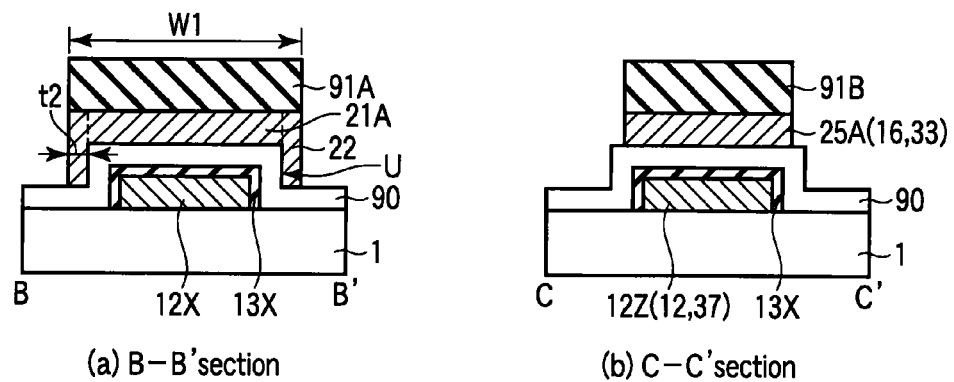

A method of manufacturing a MEMS element according to the first embodiment will be explained with reference to FIGS. 3A to 3C. Each of FIGS. 3A to 3C shows, for example, a cross-section structure of a part where a sidewall part is provided as in beams 21A and 21B and a cross-section structure of a part where a sidewall part is not provided as in signal electrode 16 and joining parts 25A and 25B. In FIGS. 3A to 3C, a cross section taken along line B-B' of FIG. 1 and a cross section taken along line C-C' will be explained. Although various manufacturing processes will be explained using the cross section taken along line C-C', the movable structure and the electrodes of the actuators will be formed in the same processes.

As shown in FIG. 3A, a conducting layer 12Y is deposited on the substrate 1 by, for example, chemical vapor deposition (CVD) techniques or sputtering techniques. Conducting layer 12Y is used for the lower signal electrode of the movable structure, the lower driving electrodes of the actuators, and the interconnect lines and dummy layer on the substrate.

Then, as shown in FIG. 3B, the conducting layer on the substrate is processed into specific patterns by, for example, photolithographic and etching techniques, thereby forming dummy layers 12X and 12Z. Dummy layer 12X is formed mainly below a region where beams supporting an upper electrode are to be formed. Processed dummy layer 12X has, for example, a width W0. Conducting layer 12Z is used for not only a dummy layer but also, for example, the lower electrode of the movable structure and the interconnect lines. To clarify explanation, conducting layer 12Z is referred to as dummy layer 12Z. In parts of the beams which need not increase the rigidity near the connection with the electrode or parts of the beams which do not increase the rigidity positively, dummy layer 12Z may be removed from the regions where those parts are to be formed. In FIGS. 3A to 3C, the planar shapes, lengths, and widths of dummy layers 12X and 12Z need not be the same and may, of course, be changed suitably according to the place where they are formed.

After the conducting layer is processed, an insulating film 13X is formed on the surface of processed conducting layer 12X by, film deposition techniques, such as thermal oxidation techniques or CVD techniques.

Then, a sacrificial layer 90 is formed on conducting layer 12X and substrate 1 by, for example, CVD techniques or coating techniques. The sacrificial layer 90 may be made of such material as metal, insulating material, semiconductor, inorganic material, or organic material, provided that the material assures a specified etching selection ratio with respect to conducting layer 12X, insulating layer 13X, and members configured in subsequent processes. After the sacrificial layer 90 is formed, anchors (not shown) are buried in the sacrificial layer 90 in, for example, specific positions on the substrate.

Then, on the sacrificial layer 90, a conducting layer 21X is formed by, for example, sputtering or CVD techniques. Conducting layer 21X is used for the upper signal electrode of the movable structure, the beams supporting the upper signal electrode, the upper driving electrodes of the actuators, the spring structure, and others. Conducting layer 21 has, for example, a film thickness t1.

In the region where dummy layer 12X is provided, there is a step Z between the top surface of the substrate 1 and the top surface of dummy layer 12Y. Since the sacrificial layer 90 is deposited on the top and side surfaces of dummy layer 12X, the sacrificial layer 90 has a convex shape facing upward because of step Z.

Consequently, conducting layer 21X sinks toward the substrate 1 according to step Z, with the result that conducting layer 21X is formed on the top and side surfaces of the convex part of the sacrificial layer 90. Conducting layer 21X covers the side of dummy layer 12X via, for example, sacrificial layer 90. For example, thickness ta of the part sunk according to step Z in a direction perpendicular to the surface of the substrate 1 is not less than thickness t1' obtained by adding thickness t1 of conducting layer 21X on the sacrificial layer 90 and the thickness of the sacrificial layer 90.

Next, as shown in FIG. 3C, resists 91A and 91B are formed on conducting layers on the sacrificial layer 90. Resists 91A and 91B are patterned by photolithographic techniques. For example, as in the cross section taken along line C-C' where rigidity is not made high, resist 91B is patterned so as to form beams and electrodes in specific shapes. In contrast, for example, as in the cross section taken along line B-B' where the rigidity of conducting layer (beam) 21A is made high, resist 91A is patterned so as to cover not only the top surface of the convex part of the sacrificial layer 90 but also the top surface of conducting layer 22 on side U of the convex part of the sacrificial layer 90.

With the patterned resists 91A and 91B as a mask, the conducting layer on the sacrificial layer 90 is etched, producing specific shapes.

At this time, in a place where the rigidity of the beam is made high, the upper part of the conducting layer on side U of the convex part of the sacrificial layer 90 is covered with conducting layer 21A. Therefore, conducting layer 22 is left on side U of the convex part, producing a structure where conducting layer 22 is provided at the end of resist 21A. Conducting layer 22 has a film thickness t2. Film thickness t2 is, for example, less than film thickness t1 in FIG. 3B. Film thickness t2 may be equal to film thickness t1.

In other places such as a C-C' section, for examples, on the top surface of the sacrificial layer 90, a specific beam, a spring structure, and a conducting layer 25 (16, 33) shaped like an electrode are formed.

Then, various constructional elements are formed by a general MEMS element forming process. An insulating layer is formed in a specific position of the conducting layer on the sacrificial layer so that the upper driving electrode of the movable structure may be connected to the upper driving electrode of the actuator.

Thereafter, the sacrificial layer 90 is selectively removed by, for example, dry etching or wet etching. Then, as shown in FIGS. 2A to 2C, beams 21 and 25 and upper electrodes 16 and 33 are formed so as to be supported in midair. Then, as shown in FIG. 2B, in a place where the rigidity of the beam is made high, sidewall parts 22 are formed at the end of beam 21A. As shown in FIGS. 2A and 2C, in other places, upper signal electrode 16 of the movable structure 10, upper driving electrodes 33 of actuators 30A and 30B, and joining parts 25 are formed. After the sacrificial layer 90 is removed, or at the same time the sacrificial layer 90 is removed, dummy 12X may be removed.

While in the above example, dummy layer 12X has been made of a material different from that of the sacrificial layer 90, it may be made of the same material as that of the sacrificial layer 90. In this case, after a conducting layer serving as the lower electrode and an insulating film on the conducting layer have been formed, the dummy layer is formed and then the sacrificial layer is formed.

By the above processes, a MEMS variable-capacitance element of the first embodiment is completed. By the manufacturing processes shown in FIGS. 3A to 3C, beam 21 with the sidewall parts 22 is formed. For example, the sidewall parts 22 are configured to have a downward-facing convex part. In a place where the sidewall part 22 is provided at the ends of each of beams 21A and 21B, dummy layer 12X is formed so that the processing dimension (width) W0 of dummy layer 12X may be equal to, for example, a value obtained by subtracting twice the film thickness of the sidewall part 22 from width W1 of each of beams 21A and 21B including the sidewall parts 22.

While in the first embodiment, dummy layer 12X and lower electrodes 12 and 37 have been formed simultaneously, using the same material, the invention is not limited to this. The material and the manufacturing process may be changed as needed. For example, taking into account a parasitic capacitance developed between adjacent dummy layers 12X or between beams 21 and 25 and dummy layer 12X, dummy layer 12X may be formed, using an insulating film or semiconductor, separately from the conducting layer serving as the lower electrode. In this case, the film thickness of the dummy layer may not be equal to the film thickness of the conducting layer serving as the lower electrode. In this way, the materials used for various members constituting the MEMS element and their dimensions may be selected freely as needed.

As described above, according to the MEMS element manufacturing method, the sidewall parts for structurally increasing the rigidity of the beams supporting the electrode can be formed at the ends of the beam. This makes it possible to increase the driving speed of the MEMS element. Moreover, the bending of the members constituting the MEMS element supported in midair like the upper signal electrode can be decreased. Accordingly, a MEMS element with improved element characteristics can be provided.

(c) Operation

The operation of the MEMS variable-capacitance element will be explained with reference to FIG. 4.

FIGS. 4A and 4B show states where the MEMS variable-capacitance element is operating.

FIG. 4A shows a state before the actuator is driven (up-state) and FIG. 4B shows a state after the actuator is driven (down-state).

As shown in FIG. 4A, the space between upper driving electrode 33 of each of actuators 30A and 30B and lower driving electrode 37 on the movable structure side is greater than the space on the spring structure side. In this case, the two electrodes 12 and 16 constituting the movable structure 10 are such that upper signal electrode 16 is supported in midair, with the distance d1 from lower signal electrode 12.

Then, a potential difference is applied between upper driving electrode 33 and lower driving electrode 37. The potential difference is produced by applying different potentials to the interconnect lines to which upper and lower driving electrodes 33 and 37 are connected. For example, ground potential is supplied to one driving electrode and a potential not lower than a pull-in voltage is applied to the other driving electrode. The pull-in voltage is a voltage at which driving electrode 33 connected to the spring structure 34 starts to operate by electrostatic attraction.

When a potential not lower than the pull-in voltage is supplied to one driving electrode, electrostatic attraction at which driving electrode 33 move develops between upper driving electrode 33 and lower driving electrode 37. Electrostatic attraction developed between driving electrodes 33 and 37 of actuators 30A and 30B becomes stronger as the distance between driving electrodes 33 and 37 gets smaller. Accordingly, upper driving electrode 33 is in contact with lower driving electrode 37 from the spring structure 34 side via insulating film 36. During the time when the potential difference is being applied to driving electrodes 33 and 37, the distance between driving electrodes 33 and 37 becomes smaller in the direction from the spring structure 34 side toward the movable structure 10 side and upper driving electrode 33 is in contact with the lower driving electrode sequentially in a zipper-like manner.

As described above, actuators 30A and 30B are driven, which causes the movable structure 10 to move.

Then, as shown in FIG. 4B, almost the entire surface of upper driving electrode 33 makes contact with lower driving electrode 37 via insulating film 38. This causes upper signal electrode 16 of the movable structure 10 connected to upper driving electrode 33 to move toward the substrate 1, facing lower signal electrode 12, with the result that the distance between upper signal electrode 16 and lower signal electrode 12 becomes smaller. For example, as shown in FIG. 4B, when upper signal electrode 16 comes into contact with lower signal electrode (signal line) 12 via insulating film 13, the distance between the two signal electrodes 12 and 16 becomes equal to the film thickness of insulating film 13.

When the potential difference between driving electrodes 33 and 37 of actuators 30A and 30B is made zero, the MEMS variable-capacitance element returns from the state (down-state) of FIG. 4B to the state (up-state) of FIG. 4A.

Accordingly, as shown in FIGS. 4A and 4B, the distance between lower signal electrode 12 and upper signal electrode 16 constituting the movable structure (variable capacitance) 10 varies in the range from the distance d1 to about the film thickness of insulating film 13. In a state after the MEMS variable-capacitance element has been driven, upper signal electrode 16 may not directly contact insulating film 13.

Accordingly, as the distance between signal electrodes 12 and 16 varies, the value of the capacitance produced by lower signal electrode 12 and upper signal electrode 16 varies. Since the capacitance is inversely proportional to the distance between the electrodes 12 and 16, when the distance between lower signal electrode 12 and upper signal electrode 16 is large, the capacitance is low. In contrast, when the distance between lower signal electrode 12 and upper signal electrode 16 is small, the capacitance is high.

To simplify the explanation, the two actuators 30A and 30B connected to the movable structure have been driven simultaneously. The invention is not restricted to this. The two actuators 30A and 30B may be driven alternately. That is, when actuator 30B on the left side has been driven, actuator 30A on the right may be made ready to be driven. In contrast, when actuator 30A on the right has been driven, actuator 30B may be made ready to be driven.

In the operation of the MEMS variable-capacitance element, for example, the driving speed of the MEMS variable-capacitance element can be expressed by the resonant frequency $f_0$ of the upper signal electrode supported by the beams. If the elastic coefficient of the upper signal electrode supported by the beams is "k" and the mass of the upper signal electrode supported by the beams is "m," the resonant frequency $f_0$ is expressed as:

$$f_0 = \frac{1}{2\pi}\sqrt{\frac{k}{m}} \qquad \text{equation (1)}$$

As shown in equation (1), the resonant frequency $f_0$ is proportional to elastic coefficient k and inversely proportional to the mass m.

As in the first embodiment, when the sidewall parts 22 are provided at the ends in the width direction of beams 21A and 21B supporting the movable structure, the rigidity of beams 21A and 21B in a direction perpendicular to the substrate surface increases remarkably. The rigidity of beams 21A and 21B is reinforced structurally, which increases the value of the elastic coefficient. In this case, although providing the sidewall parts 22 at the ends of beams 21A and 21B apparently increases the film thickness of beams 21A and 21B, an increase in the mass m is smaller than an increase in the elastic coefficient (rigidity) differently from a case where the film thickness of the entire beams is simply increased.

Accordingly, use of beams 21A and 21B with the sidewall parts 22 enables the resonant frequency $f_0$, or the driving speed, of the MEMS element to be increased.

Furthermore, an increased rigidity of beams 21A and 21B can prevent, for example, upper signal electrode 16 from bending. This makes it possible to reduce an increase in the distance between lower signal electrode 12 and upper signal electrode 16 due to the bending of signal electrode 16. Accordingly, the capacitance of the MEMS variable-capacitance element can be prevented from decreasing due to the bending of the electrode. Since the electrode 16 can be prevented from bending, a variation in the distance between signal electrodes 12 and 16 making a pair can be suppressed. That is, the deviation of the capacitance of the MEMS variable-capacitance element from the value based on the design dimensions can be suppressed.

As described above, according to the MEMS element of the first embodiment, the element characteristics of the MEMS element can be improved.

(2) Second Embodiment

Hereinafter, a second embodiment of the invention will be explained with reference to FIGS. 5 to 7C. In the second embodiment, the same structural elements as those described in the first embodiment are indicated by the same reference numerals and a detailed explanation of them will be given as needed.

Figure 5:
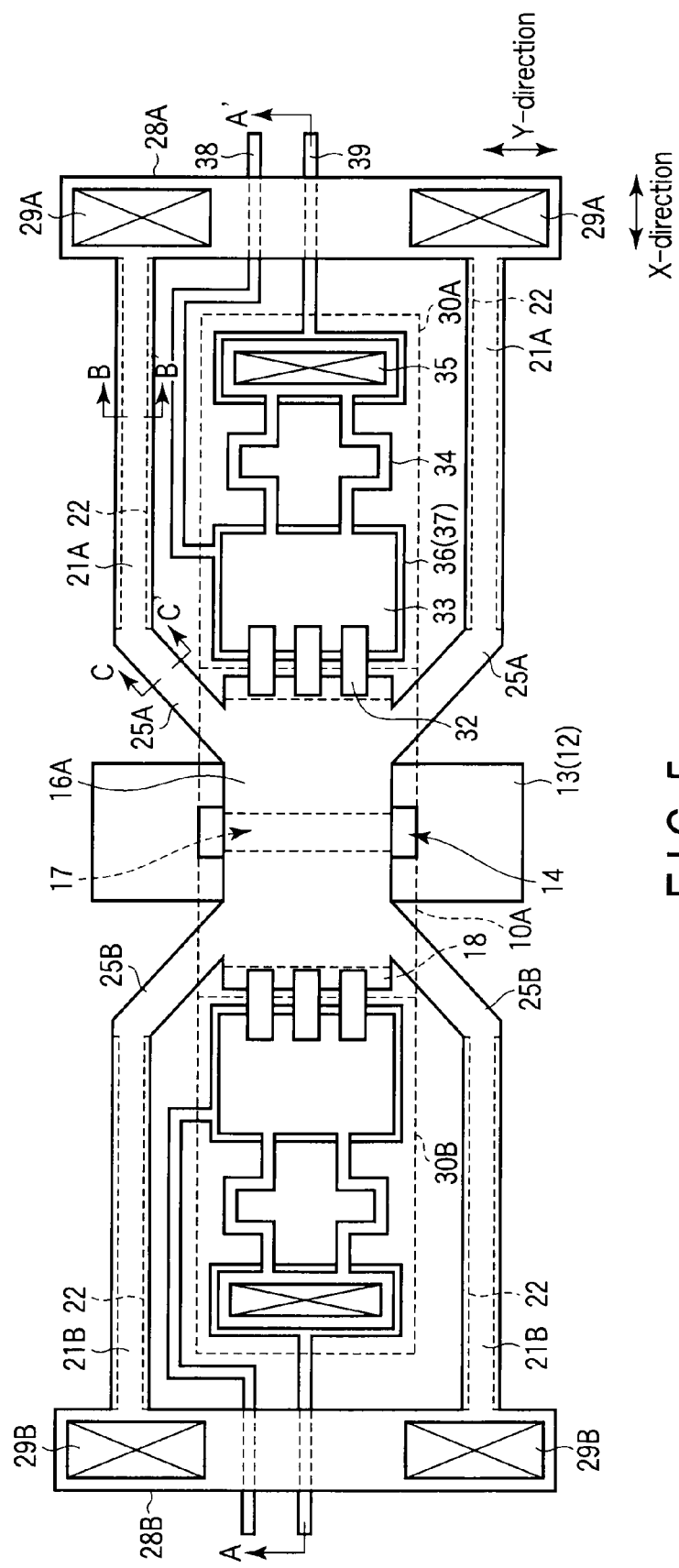
FIG. 5 is a plan view showing a structure of a MEMS element according to a second embodiment of the invention.

FIG. 5 shows a planar structure of a MEMS element according to the second embodiment. FIG. 6 shows a cross-section structure taken along line A-A' of FIG. 5. The MEMS element of the second embodiment is a MEMS variable-capacitance element as in the first embodiment.

As shown in FIGS. 5 and 6, a slit is made in a lower signal electrode 12A of a movable structure 10A. Making the slit 14 causes, for example, a part of the surface of the substrate 1 below lower signal electrode 12A to be exposed.

Above lower signal electrode 12A, an upper signal electrode 16A is provided. Upper signal electrode 16A is supported in midair by joining parts 25A and 25B, beams 21A and 21B, and anchors 29A and 29B. In the second embodiment, each of beams 21A and, 21B may or may not have sidewall parts 22 at its underside ends in the width direction.

Upper signal electrode 16A has a concave part 17 above the slit 14 in lower signal electrode 12A. The recession (bottom) of the concave part 17 extends in the direction in which the lower signal electrode (signal line) extends (or in the Y-direction). For example, protrusions (first protrusions) 18 and 19 may be provided at the ends of or on the underside of upper signal electrode 16A. In a state after the MEMS variable-capacitance element has been driven, the side of the concave part 17 and the side of the protrusion 18 face the side of lower signal electrode 12A. That is, capacitance is secured even for the side of lower signal electrode 12A and the side of upper signal electrode 16A.

A method of forming upper signal electrode 16A with the concave part 17 will be explained with reference to FIGS. 7A to 7C. In FIGS. 7A to 7C, to simplify a diagrammatic representation, the actuators are not shown and only a cross-section structure of upper and lower signal electrodes 12A and 16A constituting the movable structure 10A is shown. FIGS. 7A to 7C shows cross sections taken in the X-direction.

As shown in FIG. 7A, a conducting layer is deposited on the substrate 1 by, for example, CVD techniques or sputtering techniques. Then, a resist 92 is applied to conducting layer 12A. Resist 92 is patterned by photolithographic techniques so that electrodes, interconnect lines, and dummy layers are formed in specific shapes. With the patterned resist 92 as a mask, conducting layer 12A is etched, thereby forming lower signal electrode 12A of the movable structure. In signal electrode 12A, a slit 14 is made by the patterning and etching. The slit 14 has a dimension (width) Wa in the X-direction.

After the resist is removed, an insulating film 13 is formed on the surface of signal electrode 12A by the same process as in FIG. 4B as shown in FIG. 7B. Then, a sacrificial layer 90 and a conducting layer 16X are formed sequentially. At this time, because of the shape of the slit 14, the sacrificial layer 90 and conducting layer 16X sink toward the substrate 1, with the result that the slit 14 is filled with the sacrificial layer 90 and conducting layer 16X. As a result, in conducting layer 16X, a convex part 17 is formed. When the sacrificial layer 90 and conducting layer 16X are formed so as to make a uniform film and the sacrificial layer 90 has a film thickness to and conducting layer 16X has a film thickness tb, width Wa of the slit 14 is made not less than twice the sum of film thickness to and film thickness tb so as to prevent the sides of conducting layer 16 buried in the slit 14 from making contact with each other.

Then, as shown in FIG. 7C, a resist 93 is applied to conducting layer 16A and a pattern for forming the upper signal electrode of the movable structure is transferred to resist 93 by, for example, photolithographic techniques. Resist 93 is patterned so as to cover the concave part 17. In places where the ends of the upper signal electrode are to be formed, resist 93 is patterned so as to cover, for example, conducting layer 18 covering the sides of the upward-facing concave part of the sacrificial layer.

Then, with the patterned resist 93 as a mask, conducting layer 16A is etched, forming upper signal electrode 16A of the movable structure. At the same time, the beams and the upper driving electrodes of the actuators are formed.

As a result, upper signal electrode 16A has the concave part 17 in it. In addition, upper signal electrode 16A has the protrusions 18 at its ends.

Thereafter, resist 93 and sacrificial layer 90 are removed and upper signal electrode 16A is supported in midair.

By the above processes, the MEMS variable-capacitance element of the second embodiment is completed. As described above, the concave part 17 of upper signal electrode 16A is formed in a self-aligning manner to the slit 14 made in lower signal electrode 12A.

While in the example of FIGS. 5 and 6, the dimension in the Y-direction of the slit 14 is larger than the dimension in the Y-direction of upper signal electrode 16A. The dimension in the Y-direction of the slit 14 may, of course, be smaller than the dimension in the Y-direction of upper signal electrode 16A. While in the example, one unit of the slit 14 has been made in lower signal electrode 12A, a plurality of units of the slit 14 may be made in lower signal electrode 12A.

As in the second embodiment, when upper signal electrode 16A has the concave part 17 in it, an apparent film thickness of upper signal electrode 16A at the part where the concave part 17 is formed becomes greater, making the rigidity of upper signal electrode 16A higher. As described above, making the rigidity of upper signal electrode 16A higher reduces a warp in the electrode supported in midair, which suppresses the bending of the upper signal electrode. Therefore, an increase in the distance between the upper electrode and the lower electrode caused by the bending of the electrodes and a variation in the distance are suppressed, which improves the characteristics of the MEMS element.

Accordingly, according to the MEMS element of the second embodiment, the element characteristics can be improved.

(3) Third Embodiment

Hereinafter, a third embodiment of the invention will be explained with reference to FIG. 8. In the third embodiment, the same structural elements as those described in the first and second embodiments are indicated by the same reference numerals and a detailed explanation of them will be given as needed.

A planar structure of a MEMS element according to the third embodiment is almost the same as that of FIG. 1. Therefore, the planar structure of the MEMS element of the third embodiment will be explained with reference to FIG. 1. The structure of beams 21A and 21B supporting upper signal electrode 16 is almost the same as that of FIG. 2B, so an explanation of the structure will be omitted.

In the first and second embodiments, a MEMS variable-capacitance element has been explained. The structure of the MEMS element of the embodiments can be applied to MEMS elements other than a variable-capacitance element. In the third embodiment, the structure will be explained using a MEMS element used as a switch (hereinafter, referred to as a MEMS switch) as an example.

Figure 8:
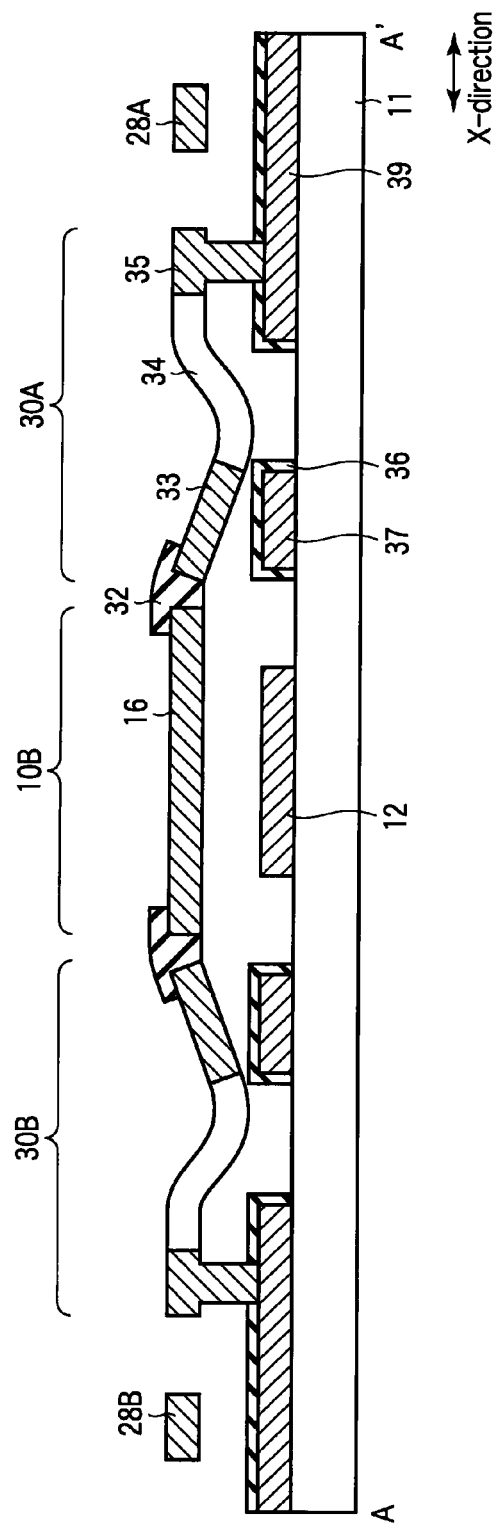
FIG. 8 is a sectional view showing a structure of a MEMS element according to a third embodiment of the invention.

FIG. 8 shows a cross-section structure of a MEMS element of the third embodiment. The cross-section structure of FIG. 8 corresponds to a cross section taken along line A-A' of FIG. 1.

In the MEMS switch of the third embodiment, each of beams 21A and 21B supporting upper signal electrode 16 has sidewall parts 22 at its ends in the width direction as shown in FIG. 2B, which increases the rigidity of beams 21A and 21B.

As shown in FIG. 8, in a movable structure 10B for the MEMS switch, an insulating film is not provided on a lower signal electrode 12 and the surface of a conducting layer constituting a lower signal electrode 12 is exposed.

As shown in FIG. 8, when upper signal electrode 16 is supported in midair (or in an up-state), the MEMS switch is off.

Then, as in the operation of the MEMS variable-capacitance element explained in FIGS. 4A and 4B, when upper signal electrode 16 is driven downward (toward the substrate) by actuators 30A and 30B (or in a down-state), the underside of upper signal electrode 16 comes into contact with the top surface of lower signal electrode 12. In this case, since there is no insulating film on the top surface of lower signal electrode 12 and the underside of upper signal electrode 16, upper signal electrode 16 and lower signal electrode 12 electrically conduct. In this way, when upper signal electrode 16 directly contacts lower signal electrode 12, the MEMS switch goes on.

A method of manufacturing the MEMS switch of the third embodiment is basically the same as the manufacturing method described in the first embodiment except that the process of removing the insulating film on the surface of lower signal electrode 12 by, for example, photolithographic techniques or etching techniques is added in front of the process of forming a sacrificial layer. Alternatively, the process of covering the surface of lower signal electrode 12 with another member may be added to prevent an insulating film from being formed. While in FIG. 8, all the insulating film on the surface of lower signal electrode 12 has been removed, a part of the insulating film on the surface of lower signal electrode 12 has only to be removed so as to allow lower signal electrode 12 and upper signal electrode 16 to conduct electrically.

Even with the MEMS of the third embodiment, the rigidity of the members constituting the MEMS element can be improved. Accordingly, the driving speed of the MEMS element can be increased and the deterioration of the element characteristics caused by the bending of the beams or electrodes can be prevented.

Accordingly, even in the MEMS element of the third embodiment, the characteristics of the MEMS element can be improved as in the first and second embodiments.

In the third embodiment, the structure of upper signal electrode 16 may, of course, have a concave part or protrusions as in the second embodiment. While in the first to third embodiments, the explanation has been given using the MEMS variable-capacitance element and MEMS switch as examples, the invention is not limited to those. For instance, use of an acceleration sensor, a pressure sensor, an RF (radio frequency) filter, a gyroscope, and a mirror device, of course, produces the same effects as in the first to third embodiments.

(4) Modifications

Hereinafter, a modification of a MEMS element according to the embodiments of the invention will be explained with reference to FIGS. 9A to 10B. The same structural elements as those described in the first to third embodiments are indicated by the same reference numerals and a detailed explanation of them will be given as needed.

Figure 9A:
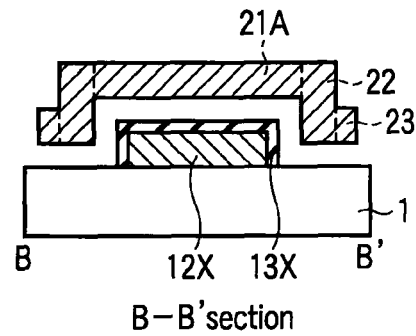
FIGS. 9A, 9B and 9C are sectional views showing structures of modifications of the MEMS element according to the embodiments.

In a modification of a MEMS element according to the embodiments, parts protruding (second protrusions) in parallel with the surface of the substrate 1 may be provided on the sides of the sidewall parts 22 as shown in FIG. 9A. The protrusions 23 protrude horizontally in the opposite direction to dummy layer 12X.

Figure 9B:
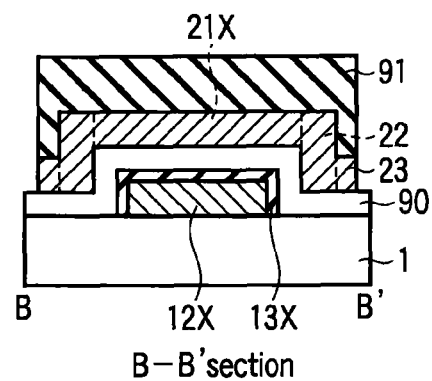

As shown in FIG. 9B, the structure is formed by patterning resist 91 so that resist 91 may cover the parts 23 protruding horizontally from the sidewall parts 22 on the sides of the sacrificial layer 90. Providing the protrusions 23 protruding in parallel with the surface of the substrate 1 (or horizontally) causes the rigidity of the sidewall parts 22 to increase. Accordingly, it is possible to prevent the sidewall parts 22 from bending toward dummy layer 12X due to a decrease in the film thickness of the sidewall parts 22 and therefore from making contact with dummy layer 12X.

Figure 9C:
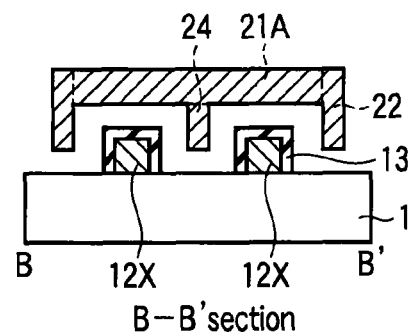

As shown in FIG. 9C, between one and the other ends of beam 21A in the width direction, a protrusion (third protrusion) 24 may be provided on the underside of beam 21A. The protrusion 24 is formed by making a slit in dummy layer 12X by the aforementioned MEMS element manufacturing method. The dimensions of the slit in the width direction are designed to be greater than twice the film thickness of the sacrificial layer 90 and not greater than twice the film thickness of the beam. Providing the protrusion 24 on the underside of beam 21A enables the rigidity of beam 21A to be improved further. As in the first embodiment, the driving speed of the MEMS element can be increased.

FIGS. 10A and 10B show a modification of the MEMS element according to the second embodiment.

As shown in FIG. 10A, a groove may be made in a lower signal electrode 12B to prevent the surface of the substrate 1 below the concave part 17A from being exposed instead of making a slit in lower signal electrode 12 of a movable structure 10C. In this structure, the top surface of the conducting layer used to form lower signal electrode 12B is retreated toward the substrate by etching as in the process shown in FIG. 7A. At that time, a groove 15 is made in the conducting layer for forming lower signal electrode 12B so as not to expose the top surface of the substrate 1. Then, in the processes shown in FIGS. 7B and 7C, when a sacrificial layer and a conducting layer are deposited on the conducting layer with the groove 15 therein, the groove causes a valley to develop in upper signal electrode 16A according to the thickness of the removed film of the lower signal electrode. As a result, a concave part 17 is formed in upper signal electrode 16A as shown in FIG. 10A.

Furthermore, as shown in FIG. 10B, a protrusion (fourth protrusion) 19 may be provided on the underside of upper signal electrode 16B.

As in the concave part 17, the protrusion 19 is formed, depending on the shape of a slit (groove) made in lower signal electrode 12A. The protrusion 19 is formed by making width Wa of the slit 14 shown in FIG. 7A greater than twice film thickness to of the sacrificial layer and not greater than twice film thickness tb of conducting layer 16X. The protrusion 19 may have a shape extending in the Y-direction or a shape extending in the X-direction unless lower signal electrode 12A is segmentalized.

As shown in FIG. 6A, when a slit is made in lower signal electrode 12, the area where the top surface of lower signal electrode 12 faces the underside of upper signal electrode 16 decreases. In contrast, in the MEMS elements shown in FIGS. 10A and 10B, the area where the top surface of lower signal electrode 12 faces the underside of upper signal electrode 16 does not decrease, which prevents the capacitance developing between the two electrodes from decreasing.

Even in the structures of upper signal electrodes 16A and 16B shown in FIGS. 10A and 10B, the rigidity of the upper signal electrode can be increased and the bending of the upper signal electrode can be suppressed.

The structures shown in FIGS. 9A to 10B can be applied to the MEMS switch of the second embodiment.

As described above, even the MEMS elements according to the modification of the embodiments produce the same effects as in the first to third embodiments.

(5) Others

While in the embodiments of the invention, a MEMS composed of a movable upper electrode and a fixed lower electrode has been used, the invention is not limited to this. For instance, even when a MEMS composed of an upper electrode and a lower electrode which are both movable is used, this produces the same effect as in the embodiments.

While in the embodiments, the explanation has been given using a MEMS element with two electrodes making a pair as an example, the invention is not limited to this. For instance, even a MEMS element with a movable intermediate electrode supported in midair between a fixed upper electrode and a fixed lower electrode produces the same effects as the MEMS elements described in the embodiments. In this case, the intermediate electrode is provided with a protrusion.

It is to be understood that the invention is not limited to the specific embodiments described above and that the invention can be embodied with the components modified without departing from the spirit and scope of the invention. Various inventions can be configured by appropriately combining the components disclosed in the embodiments described above.

For example, some components may be deleted from all components shown in the embodiments. Further, the components in different embodiments may be used appropriately in combination.

What is claimed is:

1. A MEMS element comprising:
    a first electrode provided on a substrate;
    an insulating film provided on the first electrode;
    a second electrode which is provided above the first electrode and which is driven toward the first electrode;
    an anchor provided on the substrate; and
    at least one beam which supports the second electrode in midair, one end of the at least one beam being connected to the anchor and the at least one beam including a sidewall part provided at its end in the width direction, the sidewall part having a downward-facing protrusion,
    wherein a first variable capacitance is included between the first electrode and the second electrode, and
    wherein the other end of the at least one beam is connected to the second electrode with a joining part, the width of the joining part is less than the width of the at least one beam.

2. The element of claim 1, wherein the second electrode has at its end a first protrusion protruding in a direction perpendicular to the surface of the substrate.

3. The element of claim 1, wherein the second electrode has a first concave part which sinks toward the first electrode between one and the other ends of the second electrode.

4. The element of claim 3, wherein the first electrode has a first slit or a first groove in a position facing the first concave part.

5. The element of claim 4, wherein the width of the first slit or groove is greater than twice the film thickness of the first electrode in a direction perpendicular to the substrate.

6. The element of claim 1, wherein the side of the sidewall part is provided with a second protrusion protruding in a direction parallel to the surface of the substrate.

7. The element of claim 1, wherein the substrate below the at least one beam is provided with a dummy layer, the width of the dummy layer being less than the width of the at least one beam.

8. The element of claim 7, wherein the underside of the at least one beam is provided with a third protrusion protruding in a direction perpendicular to the surface of the substrate.

9. The element of claim 8, wherein the dummy layer has a second slit in a position facing the third protrusion.

10. The element of claim 1, wherein the second electrode has on its underside a fourth protrusion protruding toward the substrate.

11. The element of claim 10, wherein the first electrode has a third slit or a third groove in a position facing the fourth protrusion.

12. The element of claim 11, wherein the width of the third slit or groove is less than twice the thickness of the first electrode in a direction perpendicular to the substrate.

13. The element of claim 1, wherein the thickness of the sidewall part in a direction parallel to the surface of the substrate is not greater than the thickness of the at least one beam in a direction perpendicular to the surface of the substrate.

14. The element of claim 1, further comprising:
    at least one driving electrode provided on the substrate and driving the second electrode.

15. The element of claim 14, wherein two driving electrodes are provided on the substrate, and the first electrode is provided between the two driving electrodes in a direction parallel to a surface of the substrate.

16. The element of claim 1, wherein the at least one beam comprises a plurality of beams, and
the plurality of beams are connected to the second electrode.

17. The element of claim 1, wherein the at least one beam comprises at least four beams, and
the at least four beams are connected to the second electrode.

18. A MEMS element comprising:
a first electrode provided on a substrate;
an insulating film provided on the first electrode;
a second electrode which is provided above the first electrode and which is driven toward the first electrode;
an anchor provided on the substrate; and
at least one beam which supports the second electrode in midair, one end of the at least one beam being connected to the anchor and the at least one beam including a sidewall part provided at its end in the width direction, the sidewall part having a downward-facing protrusion,
wherein a first variable capacitance is included between the first electrode and the second electrode, and
wherein the substrate below the at least one beam is provided with a dummy layer, the width of the dummy layer is less than the width of the at least one beam.

19. A MEMS element comprising:
a first electrode provided on a substrate;
an insulating film provided on the first electrode;
a second electrode which is provided above the first electrode and which is driven toward the first electrode;
an anchor provided on the substrate;
at least one beam which supports the second electrode in midair, one end of the at least one beam being connected to the anchor and the at least one beam including a sidewall part provided at its end in the width direction, the sidewall part having a downward-facing protrusion; and
at least one driving electrode provided on the substrate and driving the second electrode,
wherein a first variable capacitance is included between the first electrode and the second electrode.

* * * * *